United States Patent [19]

Blanchard

[11] Patent Number: 4,648,941
[45] Date of Patent: Mar. 10, 1987

[54] PROCESS FOR FORMING TWO MOS STRUCTURES WITH DIFFERENT JUXTAPOSED DIELECTRICS AND DIFFERENT DOPINGS

[75] Inventor: Pierre Blanchard, Echirolles, France

[73] Assignee: Thomson-CSF, Paris, France

[21] Appl. No.: 826,120

[22] Filed: Feb. 5, 1986

[30] Foreign Application Priority Data

Feb. 19, 1985 [FR] France ................................ 85 02366

[51] Int. Cl.⁴ .............................................. B44C 1/22
[52] U.S. Cl. .................................... 156/657; 148/187; 156/644; 156/661.1
[58] Field of Search ............... 156/629, 632, 644, 652, 156/657, 643, 661.1; 148/187; 29/580

[56] References Cited

U.S. PATENT DOCUMENTS

| | | | |
|---|---|---|---|
| 3,865,652 | 2/1975 | Agusta et al. | 148/187 |
| 4,065,847 | 12/1977 | Borel et al. | 29/578 |
| 4,077,112 | 2/1978 | Theunissen et al. | 29/580 |
| 4,210,689 | 7/1980 | Komatsu | 156/644 X |
| 4,282,647 | 8/1981 | Richman | 156/652 X |
| 4,329,186 | 5/1982 | Kotecha et al. | 156/652 X |
| 4,334,349 | 6/1982 | Aoyama et al. | 156/652 X |
| 4,420,504 | 12/1983 | Cooper et al. | 156/644 X |
| 4,543,320 | 9/1985 | Vijan | 156/643 X |

OTHER PUBLICATIONS

Patents Abstracts of Japan, vol. 5, No. 30 (E-47) [702], Feb. 24, 1981; & JP-A-55 158 674 (Tokyo Shibaura Denki K.K.) 10.12.1980.
Patents Abstracts of Japan, vol. 7, No. 58 (E-163) [1203], Mar. 10, 1983; & JP-A-57 204 165 (Sanyo Denki K.K.) 14.12.1982.

Primary Examiner—Robert Lindsay
Attorney, Agent, or Firm—Roland Plottel

[57] ABSTRACT

The process of the invention consists in depositing a doped polycrystalline silicon layer on a silica dielectric which isolates it from the substrate. By photolithographic etching zones are defined which are intended to undergo ionic implantation for the buried channel, the zones to be protected being masked by the remaining silicon.

A double silica-nitride layer is formed after the substrate has been bared in the implanted regions;

Photolithographic etching of the double silica-nitride layer gives access to the first silicon level of a second doped silicon layer.

Photoetching of the whole of the two silicons allows different structures to be formed in which for example the transition zone between the two dielectrics is situated under the same gate or else in which for example the transition zone is self aligned with a gate.

6 Claims, 15 Drawing Figures

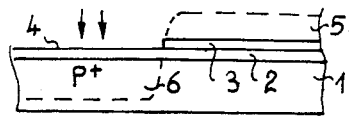
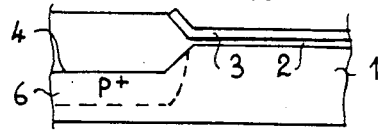
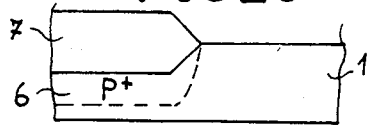
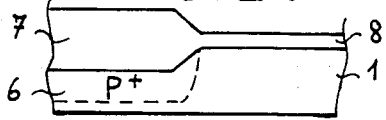
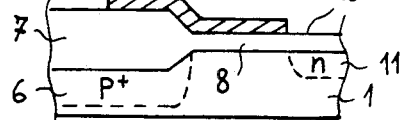
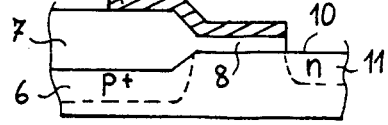
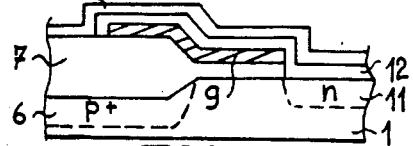
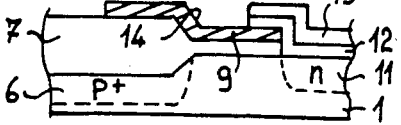
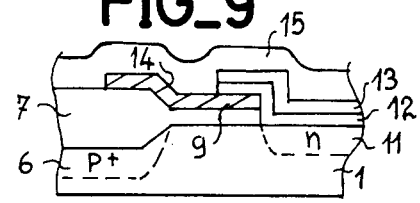
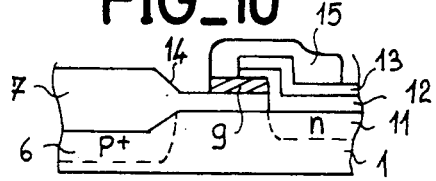
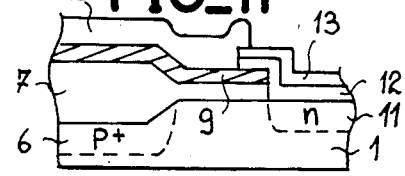
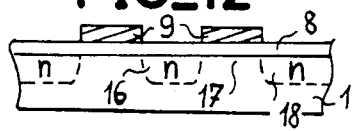
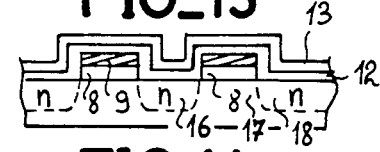
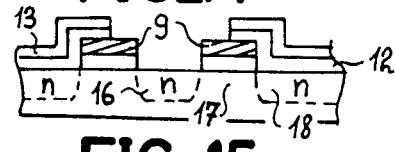
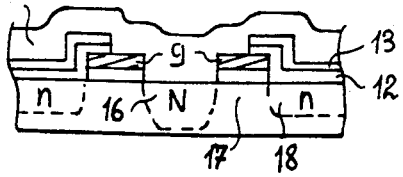

PROCESS FOR FORMING TWO MOS STRUCTURES WITH DIFFERENT JUXTAPOSED DIELECTRICS AND DIFFERENT DOPINGS

BACKGROUND OF THE INVENTION

The present invention relates to a process for forming two MOS structures with different juxtaposed dielectrics and different dopings on a semiconductor substrate, for isolating in a different way the regions of the substrates where the channel is situated on the surface and those where the channel is situated in the mass and a frame transfer matrix obtained by this process. It also relates to a frame transfer matrix obtained by this process.

DESCRIPTION OF THE PRIOR ART

In order to obtain good insulation between a gate electrode and its substrate in charge transfer devices it is known to place, between the gate and the substrate, a double dielectric layer comprising a first layer of silicon dioxide in contact with the substrate and a second layer of silicon nitride covering the first layer.

This double dielectric layer which covers both the regions of the substrate where the channel is situated on the surface and the region where it is situated in the mass, cause variations in the electronic behavior of the circuits thus constructed and generates, more particularly, in charge transfer optoelectronic semiconductor devices, variations in the thresholds and the conduction characteristics of the MOS transistors forming them, which adversely affects the correct operation of these devices.

One way of overcoming these difficulties would be to form on the substrate only a single oxide layer opposite the regions where the channel is situated on the surface and a double oxide layer in the regions of a substrate where the channel is formed in the mass, which would have the advantage of keeping, for charge transfer optoelectronic circuits, the double layer over the largest part of these circuits.

But the accuracy of positioning the transition zones between single and double layer and the gates or electrodes which are associated therewith would depend entirely in this solution on that of the photolithographic machines and would make this solution expensive and inadaptable to mass production.

SUMMARY OF THE INVENTION

The aim of the invention is to overcome the above mentioned disadvantages.

For this, the invention provides a process for forming two MOS structures with different juxtaposed dielectrics and with different dopings on a semiconductor substrate, for isolating in different ways the regions of a substrate in which the channel is situated on the surface and those in which the channel is situated in the mass, which process consists in forming on a surface of a substrate a first silicon oxide layer then a second silicon nitride layer above the first layer, etching the second silicon nitride layer by photolithography so as to form a first window and define the isolating regions, causing a thick isolating oxide self aligned with the double oxide and nitride layer to grow inside the window, replacing the double silicon oxide and nitride layer by a third silicon oxide layer forming the first dielectric, depositing a fourth layer of a material formed by doped silicon, etching in the fourth layer a second window for defining a canal region in the mass by means of the mask thus formed, baring the surface of the substrate defined by the second window and by the thick oxide, doping the substrate through the second window, oxidizing then depositing a double silicon dioxide and silicon nitride layer above the doped silicon layer and the bared part of the substrate, removing the double silicon dioxide and silicon nitride layer above the fourth doped silicon layer which served as mask for obtaining the second window, depositing a fifth silicon layer above the fourth doped silicon layer and the remaining double silicon dioxide and silicon nitride layer covering the second window and etching the fifth doped silicon layer as well as the silicon layer so as to form a gate.

BRIEF DESCRIPTION OF THE DRAWINGS

Other features and advantages of the invention will be clear from the following description with reference to the accompanying drawings which are given solely by way of example and in which:

FIGS. 1 to 10 show the different phases of the process of the invention,

FIG. 11 shows a variant of the process of the invention,

FIGS. 12 to 15 show the principle for forming an antidazzle system of a frame transfer matrix obtained using the process of the invention.

DESCRIPTION OF THE PREFERRED EMBODIMENT

The first step of the process of the invention which is shown in FIG. 1 consists in forming on the upper surface of a substrate 1 a first silicon oxide layer 2 then a second silicon nitride layer 3 above the first layer and finally forming a window 4 using a mask 5 by photolithographic etching so as to implant through window 4 boron particles in a region 6 in the mass inside the substrate opposite window 4, so as to isolate the active parts of the circuit. The next step, shown in FIG. 2, consists in causing a thick isolating oxide to grow above the substrate 1 in the region defined by the window 4. The double silicon oxide 2 and nitride 3 layer is removed in the step shown in FIG. 3 and it is replaced by another silicon oxide layer 8 so as to form a single layer, and a thin silicon layer doped for example with phosphorous is deposited in the step shown in FIG. 5 above the single layer 8 then is etched by photolithography so as to define a channel zone in the mass opposite a window 10, in a region 11 in the mass of substrate 1 situated opposite window 10. In the step shown in FIG. 6, the surface of substrate 1 is bared in window 10 so as to allow the implantation for example of arsenic in the mass region 11 opposite the window 10. In the next step, shown in FIG. 7, a double silica and silicon nitride layer is formed above the phosphorous doped silicon layer 9 and window 10 and is oxidized so as to form a dielectric of good quality. In the step shown in FIG. 8, photolithographic etching is performed so as to remove the double oxide and nitride layer 12 and 13 above the doped silicon layer 9 using a mask placed above the doped region opposite window 10. Finally, in the step shown in FIG. 9, a doped silicon deposit 15 is formed on the whole of the previously described layers so as to form, in the step shown in FIG. 10, a gate 15 above the transition zone between the double oxide and nitride layer 12, 13 and the single oxide layer 8, and so as to form a gate above this transition zone.

The process which has just been described allows a gate to be etched above a transition zone defining a single and a double oxide layer, the gate being formed by the two silicon deposits This same process may be used for a circuit having two silicon gate levels. For that, in the portion reserved for the formation of the gate, the thin silicon may be kept covered by the double layer as is shown in FIG. 7. Gate level 1 is etched according to this configuration. On the nitride thus laid bare the isolating oxide between gate levels does not change structure. The double layer may be removed by photolithographic etching so as to obtain the same conditions as those shown in FIG. 8 except however that the second gate level replaces the first level.

The process of the invention which has just been described is also applicable for obtaining self aligned gates at the transition zone between simple and double layer or for obtaining gates whose dielectric is mixed: both single and double layer. In the first case, the process of the invention which has just been described remains applicable and only the positioning of the gate concerned differs, such positioning being above the first deposit of the thin silicon layer 9 which defines in this case the self alignment zone as is shown in FIG. 11. In the second case, the process still remains the same except for the positioning, as shown in FIG. 10. The simple fact of keeping the thin silicon layer 9 or not before forming the double silica and silicon nitride layer allows the single or double layer zones to be defined.

An example of applying the process of the invention to the formation of frame transfer matrices using an antidazzle system is described hereafter with references to FIGS. 12 to 15. In the antidazzle systems of frame transfer matrices, a diode is formed from one of the two gates which form each pixel of the charge transfer matrix forming the system. A potential barrier due to the non implantation of inverse impurity in the substrate forms a transfer zone which isolates the diode from the reservoir capacities serving for the transfer of charges and the excess charges are removed by the diode thus formed and this in a permanent way. One of the gates which forms the frame transfer matrix is situated partially above a region in which the channel is situated on the surface. This region separates the collection diode which removes the excess charges from a region in which the channel is situated in the mass. The process of the invention allows this system to be formed in the way shown in FIGS. 12 to 15. In FIG. 12, after forming the gate oxide 8 serving as dielectric for isolating the regions of substrate 1 where the channel is situated on the surface, a thin silicon layer 9 is deposited than etched. Such etching defines a region 16 in which the collection diode is to be formed, a region 17 in which the channel is situated on the surface for substrate 1 and a region 18 in which the channel is situated in the mass inside substrate 1. In the next step shown in FIG. 13, the substrate is bared in the windows thus formed and a double silica and silicon nitride layer 12, 13 is deposited for forming the dielectric above the portion where the channel is situated in the mass. The double silica and silicon nitride layer is etched by photolithography in the step shown in FIG. 14 for baring the portion or the region of substrate 17 where the collection diode is to be formed. The collection diode is then formed in the step shown in FIG. 15 by depositing doped silicon 15 which, after etching, forms the level of the gate of the antidazzle system.

What is claimed is:

1. A process for forming two MOS structures with different juxtaposed dielectrics and different dopings on a semiconductor substrate, for isolating in different ways the regions of the substrate where the channel is situated on the surface and those where the channel is situated in the mass comprising the steps of forming on a surface of the substrate a first silicon oxide layer then a second silicon nitride layer above the first layer, etching the second silicon nitride layer by photolithography so as to form a first window and define the isolating regions, causing a thick isolating oxide self-aligned with the double oxide and nitride layer to grow inside the window, replacing the double silicon oxide and nitride layer by a third silicon oxide layer forming the first dielectric, depositing a fourth layer of a material formed by doped silicon, etching in the fourth layer a second window for defining a channel region in the mass by means of the mask thus formed, baring the surface of the substrate defined by the second window and by the thick oxide, doping the substrate through the second window, oxidizing then depositing a double silicon dioxide and silicon nitride layer above the doped silicon layer and the bared portion of the sustrate, removing the double silicon dioxide and silicon nitride layer above the fourth doped silicon layer which served as mask for obtaining the second window, and depositing a fifth silicon layer above the fourth doped silicon layer and the remaining double silicon dioxide and silicon nitride layer covering the second window and etching the fifth doped silicon layer as well as the silicon layer for forming a gate.

2. The process as claimed in claim 1, further consisting in etching the fourth and the fifth silicon layers for forming the gate above the transition zone between the third silicon oxide layer and the double silicon dioxide and silicon nitride layer covering the second window.

3. The process as claimed in claim 1, further consisting in etching the fourth and fifth silicon layers for keeping the self alignment formed by the fourth silicon layer at the transition zone between the third silicon oxide layer and the double silicon dioxide and silicon nitride layer covering the second window.

4. The process as claimed in claim 1, further consisting in etching the fifth silicon layer and the fourth silicon layer in a zone whose dielectric is formed by a single layer so as to obtain a gate or electrode whose channel is situated on the surface.

5. The process as claimed in claim 1, further consisting in etching the fifth silicon layer in a zone whose dielectric is formed by the double silicon dioxide and silicon nitride layer so as to obtain a gate or an electrode whose channel is situated in the mass.

6. The process as claimed in claim 5, wherein the substrate is doped in the mass inside the second window by arsenic or phosphorous.

* * * * *